(12) United States Patent
Narushima et al.

(10) Patent No.: US 9,390,933 B2
(45) Date of Patent: Jul. 12, 2016

(54) ETCHING METHOD, STORAGE MEDIUM AND ETCHING APPARATUS

(71) Applicant: TOKYO ELECTRON LIMITED, Tokyo (JP)

(72) Inventors: Kensaku Narushima, Nirasaki (JP); Kohichi Satoh, Nirasaki (JP); Motoko Nakagomi, Nirasaki (JP); Eiichi Komori, Nirasaki (JP); Taiki Katou, Tsukuba (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/579,262

(22) Filed: Dec. 22, 2014

(65) Prior Publication Data

US 2015/0187593 A1    Jul. 2, 2015

(30) Foreign Application Priority Data

Dec. 26, 2013  (JP) .................................. 2013-270504
Dec. 5, 2014   (JP) .................................. 2014-246894

(51) Int. Cl.
*H01L 21/302*  (2006.01)
*H01L 21/306*  (2006.01)
*H01L 21/67*   (2006.01)

(52) U.S. Cl.
CPC ...... *H01L 21/30604* (2013.01); *H01L 21/6708* (2013.01); *H01L 21/67069* (2013.01)

(58) Field of Classification Search
CPC ............ H01L 21/302; H01L 21/02063; C23C 1/4405; H01J 37/32394
USPC ....................... 438/735; 216/37, 67
See application file for complete search history.

(56) References Cited

U.S. PATENT DOCUMENTS

2010/0129958 A1* 5/2010 Chang et al. ................... 438/102
2011/0061812 A1* 3/2011 Ganguly et al. .......... 156/345.34

FOREIGN PATENT DOCUMENTS

JP       2009-158774 A       7/2009

* cited by examiner

*Primary Examiner* — Duy Deo
*Assistant Examiner* — Maki Angadi
(74) *Attorney, Agent, or Firm* — Nath, Goldberg & Meyer; Jerald L. Meyer

(57) ABSTRACT

There is a method of selectively etching a silicon oxide film among a silicon nitride film and the silicon oxide film formed on a surface of a substrate to be processed, the method including: under a vacuum atmosphere, intermittently supplying at least one of a first processing gas composed of a hydrogen fluoride gas and an ammonia gas and a second processing gas composed of a compound of nitrogen, hydrogen and fluorine, to the substrate to be processed multiple times.

11 Claims, 11 Drawing Sheets

ETCHING METHOD, STORAGE MEDIUM AND ETCHING APPARATUS

CROSS-REFERENCE TO RELATED APPLICATIONS

This application claims the benefit of Japanese Patent Application Nos. 2013-270504 and 2014-246894, filed on Dec. 26, 2013 and Dec. 5, 2014, in the Japan Patent Office, the disclosure of which is incorporated herein in their entirety by reference.

TECHNICAL FIELD

The present disclosure relates to a technique for performing an etching process by supplying a processing gas onto a surface of a substrate to be processed.

BACKGROUND

In a semiconductor transistor, regions of source/drain (S/D) in the vicinity of a gate are formed of Si (silicon), SiGe (silicon germanium) or the like. In a manufacturing process of the transistor, there is a need to remove a silicon oxide ($SiO_2$) film as a native oxide film that is formed on surfaces of the S/D regions, after forming contact holes. A variety of insulating films such as an SiN (silicon nitride) film for controlling a dielectric constant are formed in the vicinity of the gate. As such, etching of the native oxide film with a high selectivity to the SiN film is required. Here, a chemical formula of the silicon nitride is abbreviated as "SiN" without considering the stoichiometry.

A method based on a chemical oxide removal (COR) process using an HF (hydrogen fluoride) gas and an $NH_3$ (ammonia) gas has been known as a method of removing an $SiO_2$ film as the native oxide film. The etch of the $SiO_2$ film formed on a surface of a semiconductor wafer requires supplying a mixed gas of the HF gas and the $NH_3$ gas into a processing vessel and producing an $(NH_4)_2SiF_6$ (ammonium fluorosilicate) gas through the reaction of the mixed gas with the silicon oxide. The $SiO_2$ film is removed (or etched) by heating and subliming the $(NH_4)_2SiF_6$ gas. However, this method causes a problem in that the SiN film also reacts with the HF gas and the $NH_3$ gas, thus being etched.

In recent years, there is a method of forming an SiN film at a relatively low temperature so as to suppress damage to a surface of a semiconductor substrate. In such a low temperature, the SiN film tends to be a porous film. This results in the increased tendency to etch the SiN film, thus causing a need for a significantly high level of selectivity.

SUMMARY

Some embodiments of the present disclosure provide a method and apparatus which are capable of etching an $SiO_2$ film with a high selectivity with respect to an SiN film on a substrate to be processed having the $SiO_2$ film followed by the SiN film formed thereon.

According to one embodiment of the present disclosure, there is provided a method of selectively etching a silicon oxide film among a silicon nitride film and the silicon oxide film formed on a surface of a substrate to be processed, the method including: under a vacuum atmosphere, intermittently supplying at least one of a first processing gas composed of a hydrogen fluoride gas and an ammonia gas and a second processing gas composed of a compound of nitrogen, hydrogen and fluorine, to the substrate to be processed multiple times.

According to another embodiment of the present disclosure, there is provided a non-transitory computer-readable storage medium storing a program for causing a computer to execute a method of selectively etching a silicon oxide film among a silicon nitride film and the silicon oxide film formed on a surface of a substrate to be processed loaded into a process vessel, wherein the program includes instructions to execute the aforementioned method.

According to another embodiment of the present disclosure, there is an apparatus of selectively etching a silicon oxide film among a silicon nitride film and the silicon oxide film formed on a surface of a substrate to be processed, the apparatus including: a process vessel provided with a mounting unit configured to mount the substrate to be processed thereon; a gas supply unit configured to supply at least one of a first processing gas composed of a hydrogen fluoride gas and an ammonia gas and a second processing gas composed of a compound of nitrogen, hydrogen and fluorine to the substrate to be processed mounted on the mounting unit; a vacuum exhaust unit configured to vacuum-exhaust an interior of the process vessel; and a control unit configured to output a control signal so that the substrate to be processed is intermittently exposed to the at least any one of the first and second processing gases.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
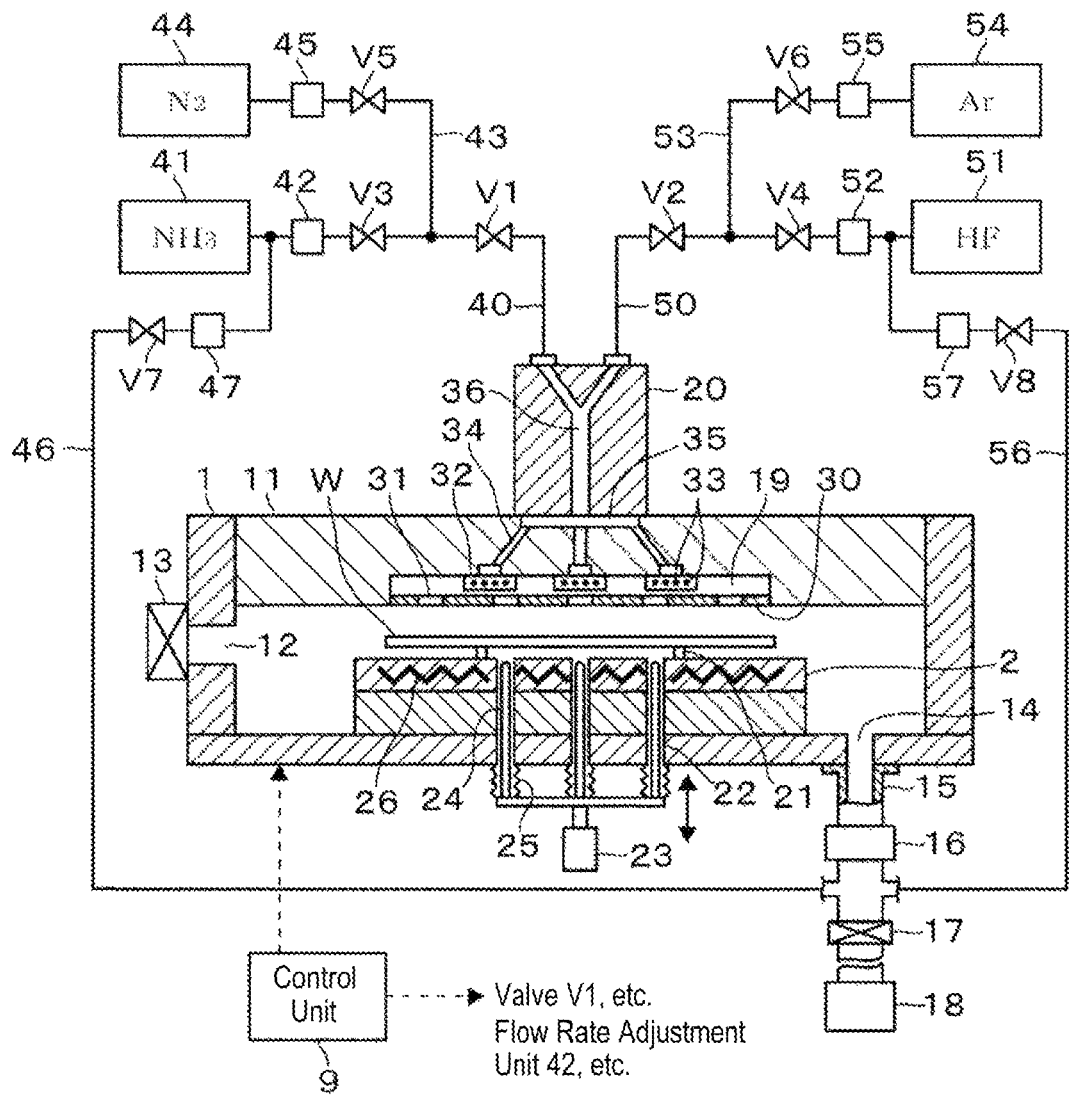
FIG. 1 is a longitudinal sectional view showing an etching apparatus according to an embodiment of the present disclosure.

As shown in FIG. 1, an etching apparatus 100 according to an embodiment of the present disclosure is provided with a process vessel 1 that is a vacuum chamber having a circular transverse cross section, and a ceiling plate part 11. The process vessel 1 has an inlet/outlet 12 formed in a lateral surface thereof to transfer a semiconductor wafer (hereinafter, simply referred to as a "wafer") W used as a substrate to be processed. A gate valve 13 is installed at the inlet/outlet 12 to open and close the inlet/outlet 12.

A cylindrical stage 2 that is a mounting table on which the wafer W is mounted, is provided inside the process vessel 1. A plurality of (e.g., seven) support pins 21 is installed on an upper surface of the stage 2. The support pins 21 support the wafer W from the upper surface of the stage 2 with an interval of, e.g., 0.3 mm. The support pins 21 are installed to protrude upwardly from the upper surface of the stage 2 at regular intervals in a circumferential direction of the stage 2. In addition, three through holes 22 penetrating through the stage 2 and a bottom surface of the process vessel 1 are formed at regular intervals in the circumferential direction. Lifting pins 24 used to transfer the wafer W are installed inside the through holes 22 respectively such that they come in and out of the upper surface of the stage 2 by a lift mechanism 23. In addition, a lower portion of each of the lifting pins 24 is covered with a respective bellows 25 configured to seal the process vessel 1.

A heater 26 used as a heating unit is installed inside the stage 2 such that the wafer W mounted on the stage 2 is heated to a predetermined temperature. An exhaust port 14 is formed in the bottom surface of the process vessel 1. The exhaust port 14 is connected to an exhaust pipe 15. The exhaust port 14 is also coupled to a vacuum exhaust pump 18 (used as a vacuum exhaust mechanism) through a series of a pressure adjustment valve 16 and an on/off valve 17. Parts including the exhaust pipe 15 and the like constitute a vacuum exhaust unit.

A recess 19 is formed in the central region of a bottom surface of the ceiling plate part 11 of the process vessel 1. A diffusion plate 30 is disposed to cover the recess 19 while facing the stage 2. The diffusion plate 30 is formed in a circular disc shape and is made of a material having a high thermal conductivity, such as aluminum. The diffusion plate 30 may be configured as a punched plate in which a plurality of gas discharge holes 31 bored in a thickness direction is arranged in a matrix pattern.

Eight gas diffusion units 32 are provided in the recess 19 above the diffusion plate 30 at regular intervals in the circumferential direction. Each of the gas diffusion units 32 is configured by a flat cylindrical member and has a plurality of discharge holes 33 formed in its lateral surface at regular intervals in the circumferential direction. An upper surface of each of the gas diffusion units 32 is connected to one end of a respective internal flow path 34 which is formed within the ceiling plate part 11. The other ends of the internal flow paths 34 are connected to a gas dispersion room 35 formed in an upper surface of the ceiling plate part 11. A protrusion structure 20 is installed on the upper surface of the ceiling plate part 11. The protrusion structure 20 includes an external flow path 36 having two branched upper ends and a unified lower end that is opened to the dispersion room 35.

One of the branched upper ends of the external flow path 36 is connected to a downstream end of an $NH_3$ gas supply pipe 40. The other branched upper end of the external flow path 36 is connected to a downstream end of an HF gas supply pipe 50. First, a configuration of the $NH_3$ gas supply pipe 40 (an $NH_3$ gas supply system) will be described. In the $NH_3$ gas supply pipe 40, an $NH_3$ gas supply source 41, a flow rate adjustment unit 42, a valve V3 and a valve V1 are installed in sequence from upstream. An $N_2$ supply pipe 43 for supplying $N_2$ (nitrogen) gas as a carrier gas (dilution gas) has one end connected between the valve V3 and the valve V1 in the $NH_3$ gas supply pipe 40. In the $N_2$ gas supply pipe 43, an $N_2$ gas supply source 44, a flow rate adjustment unit 45 and a valve V5 are installed in sequence from upstream. In addition, an upstream end of a bypass pipe 46 is connected between the $NH_3$ gas supply source 41 and the flow rate adjustment unit 42 in the $NH_3$ gas supply pipe 40, and a downstream end of the bypass pipe 46 is connected to the exhaust pipe 15. In the bypass pipe 46, a flow rate adjustment unit 47 and an on/off valve V7 are installed in sequence from upstream.

Next, a configuration of the HF gas supply pipe 50 (an HF gas supply system) will be described. In the HF gas supply pipe 50, an HF gas supply source 51, a flow rate adjustment unit 52, a valve V4 and a valve V2 are installed in sequence from upstream. A downstream end of an Ar gas supply pipe 53 configured to supply Ar (argon) gas as a carrier gas (dilution gas) is connected between the valve V4 and the valve V2 in the HF gas supply pipe 50. In the Ar gas supply pipe 53, an Ar gas supply source 54, a flow rate adjustment unit 55 and a valve V6 are installed in sequence from upstream. In addition, an upstream end of a bypass pipe 56 is connected between the HF gas supply source 51 and the flow rate adjustment unit 52 in the HF gas supply pipe 50, and a downstream end of the bypass pipe 56 is connected to the exhaust pipe 15. In the bypass pipe 56, a flow rate adjustment unit 57 and an on/off valve V8 are installed in sequence from upstream.

Now, a flow of gases supplied from each of the $NH_3$ gas supply pipe 40 and the HF gas supply pipe 50 into the process vessel 1 through the external flow path 36 will be described. The gases supplied from each of the $NH_3$ gas supply pipe 40 and the HF gas supply pipe 50 are joined and mixed inside the external flow path 36. The mixed gas is defined as a processing gas. This processing gas is introduced into the dispersion room 35 where the gas is dispersed into the eight internal flow paths 34. The dispersed processing gas is radially discharged into the recess 19 through the discharge holes 33 formed in the lateral surface of the gas diffusion units 32. The processing gas distributed inside the recess 19 is discharged into the process vessel 1 through the gas discharge holes 31 formed in the diffusion plate 30. In this embodiment, the diffusion plate 30 corresponds to a gas supply unit, and the branch point of the external flow path 36 (a junction position as viewed from upstream) corresponds to a mixing unit.

The process vessel 1 includes a heater (not shown) to maintain the external flow path 36, the dispersion room 35, the internal flow paths 34, the gas diffusion units 32, the diffusion plate 30 and the process vessel 1 to, e.g., a temperature of 140±10 degrees C. This configuration controls precipitation of byproducts (e.g., $NH_4F$) that is generated by the reaction of the $NH_3$ gas with the HF gas inside the external flow path 36 and the like, thus suppressing particles.

Further, the etching apparatus 100 includes a control unit 9. The control unit 9 is configured with, e.g., a computer, and includes a program, a memory, and a CPU (Central Processing Unit). A group of steps (or instructions) which allows a series of operations (which will be described later) to be performed is written in the program. By the program, opening and closing of each of the valves V1 to V8, adjustment of flow rates of respective gases, adjustment of an internal pressure of the process vessel 1 and the like are performed. With the program being stored in a computer storage medium, for example, a storage part such as a flexible disk, a compact disk, a hard disk, a magneto optical disk or the like, the program is installed in the control unit 9.

Figure 2:
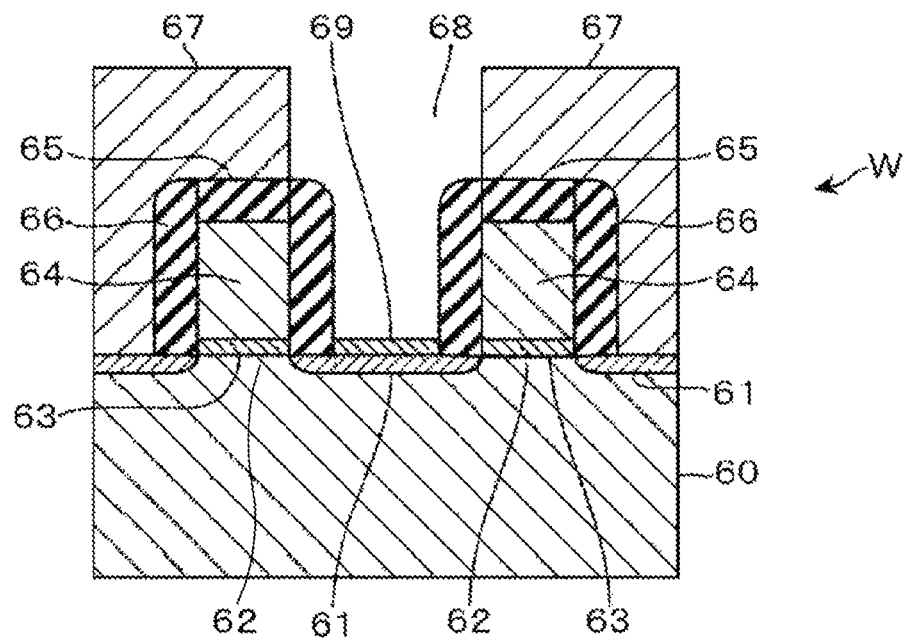
FIG. 2 is a longitudinal sectional view showing a surface structure of a substrate to be processed.

Next, the effects of the embodiment of the present disclosure will be described. First, an example of a surface structure of the wafer W loaded in the etching apparatus 100 is shown in FIG. 2. As shown in FIG. 2, a silicon layer 60 is doped with n-type or p-type impurities. Source/drain (S/D) regions 61 of different conductive types are formed on a surface of the silicon layer 60. Gate insulating films 63 composed of a thermal oxide film are formed on a respective channel region 62 formed between the S/D regions 61. A conductive polysilicon film 64 used as a gate electrode is formed on each of the gate insulating films 63. A cap layer 65 made of, e.g., SiN, is formed on each of the polysilicon films 64. An SiN film 66 used as an insulating film is formed on sidewalls of each of the polysilicon films 64. Interlayer insulating films 67 are formed on the surface of the wafer W, and subsequently, an etching process is performed to expose the SiN films 66 and the S/D region 61. Thus, a contact hole 68 is formed. At a bottom portion of the contact hole 68, the exposed surface of the S/D region 61 is brought into contact with oxygen, for example, the atmosphere, so that an $SiO_2$ film 69 used as a native oxide film is formed on the exposed surface of the S/D region 61.

Figure 3:
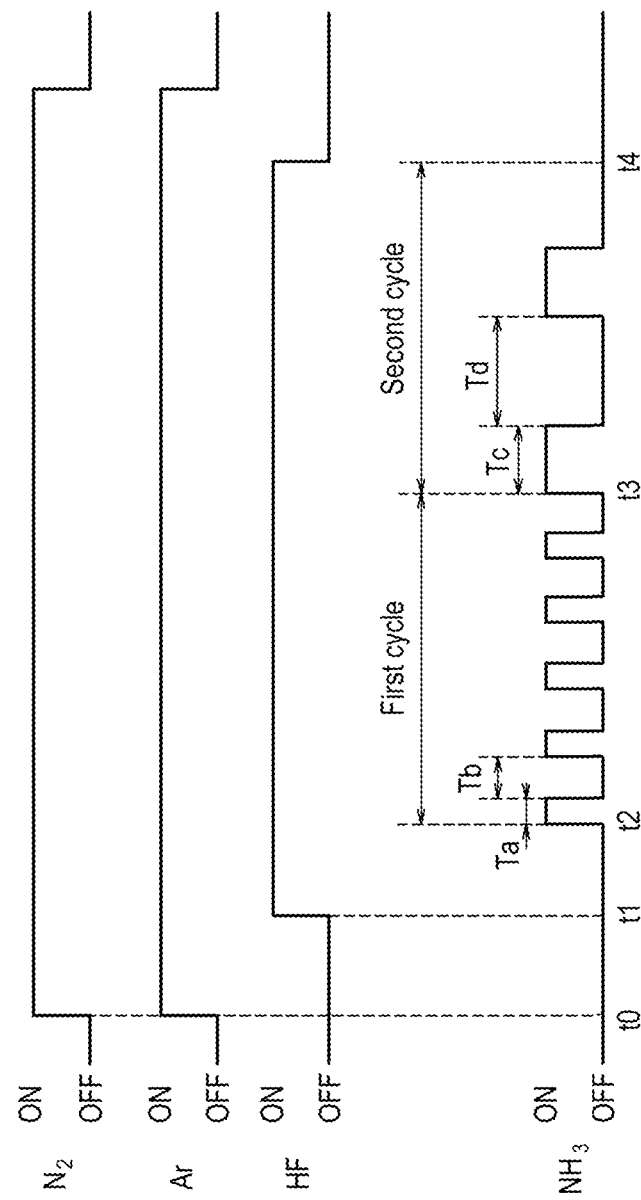
FIG. 3 is a time chart showing a supply/shutoff of a processing gas in an embodiment of the present disclosure.

A process of etching the $SiO_2$ film 69 formed on the wafer W will be described with reference to FIG. 3. FIG. 3 is a time chart showing supply (ON) and shutoff (OFF) of each of the processing gases. The wafer W is mounted on the stage 2 by, e.g., the cooperation of an external transfer arm (not shown) and the lifting pins 24 and subsequently, is heated by the heater 26 to a temperature of, e.g., 115 degrees C.

In the meantime, after the gate valve 13 is closed to seal the process vessel 1, at time t0 in FIG. 3, the valve V1 and the valve V5 are opened to supply the $N_2$ gas at a flow rate of, e.g., 450 sccm. Simultaneously, the valve V2 and the valve V6 are opened to supply the Ar gas at a flow rate of, e.g., 450 sccm. The $N_2$ gas and the Ar gas are mixed at the junction portion of the external flow path 36. The mixed gas of the $N_2$ gas and the Ar gas is supplied into the process vessel 1 through the gas discharge holes 31 of the diffusion plate 30, as described above.

Thereafter, a process in which a mixed gas of the HF gas and the $NH_3$ gas is intermittently supplied onto the wafer W, is performed. In this embodiment, first, at time t1, the valve V4 shown in FIG. 1 is opened to allow flow of the HF gas at a flow rate of, e.g., 200 sccm, such that the HF gas is mixed with the Ar gas. At this time, since the $N_2$ gas is also introduced into the external flow path 36, the HF gas is diluted with the Ar gas and the $N_2$ gas. The diluted HF gas is supplied onto the wafer W through the gas discharge holes 31 of the diffusion plate 30 in a shower form. As described above, since the flow rates of the $N_2$ gas and the Ar gas are set to 450 sccm, respectively, the HF gas diluted with the Ar gas and the $N_2$ gas has a flow rate of 1100 sccm.

Figure 4:
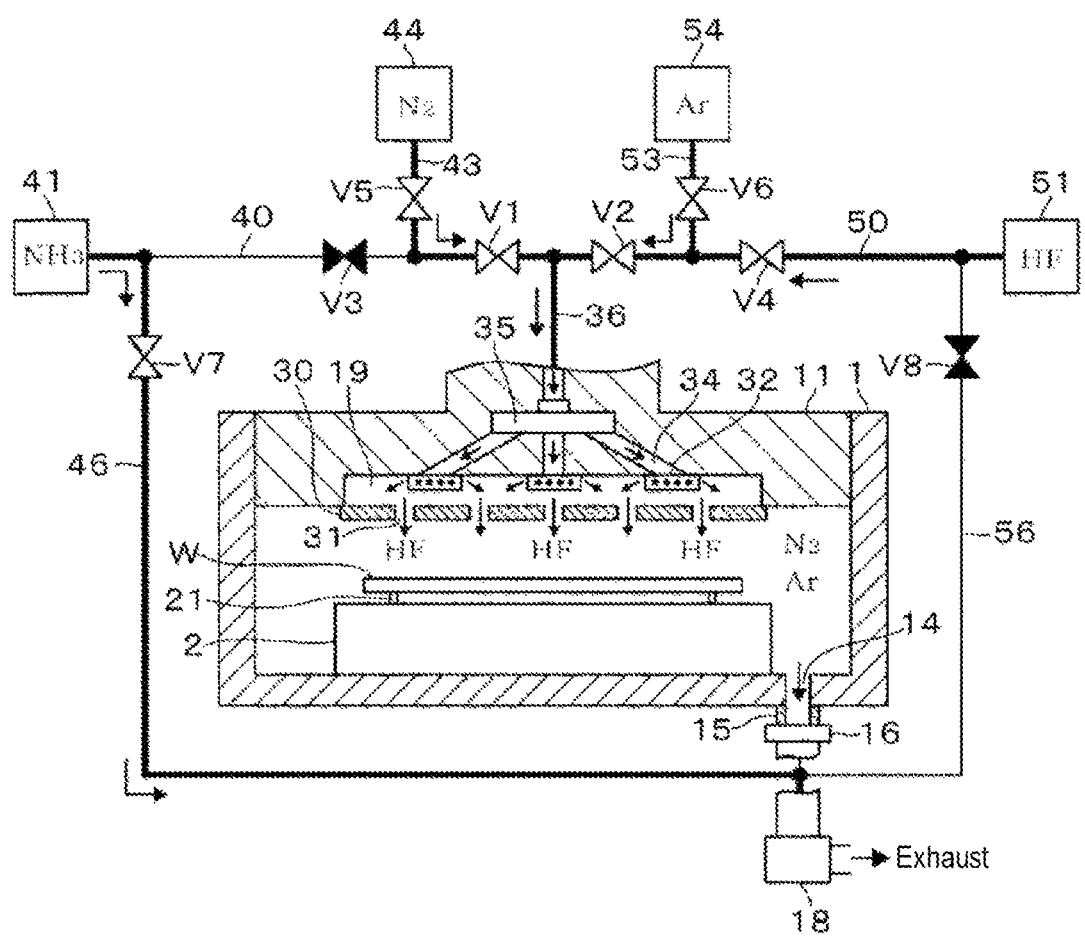
FIGS. 4 and 5 are views illustrating an operation of the etching apparatus according to an embodiment of the present disclosure.

At this time, as shown in FIG. 4, in the $NH_3$ gas supply system, the valve V7 is opened and the valve V3 is closed. Then, the $NH_3$ gas flows through the bypass pipe 46 at a flow rate of, e.g., 100 sccm, such that the $NH_3$ gas is exhausted by the vacuum exhaust pump 18 while bypassing the process vessel 1. Then, at time t2 (after a lapse of, e.g., 6 seconds from time t1), a first operation in which the valve V7 is closed and the valve V3 is opened during a period of time Ta and a second operation in which the valve V7 is opened and the valve V3 is closed during a period of time Tb, are performed. For example, these first and second operations are repeated five times, which will be sometimes referred to as a "first cycle or initial duration."

Figure 5:
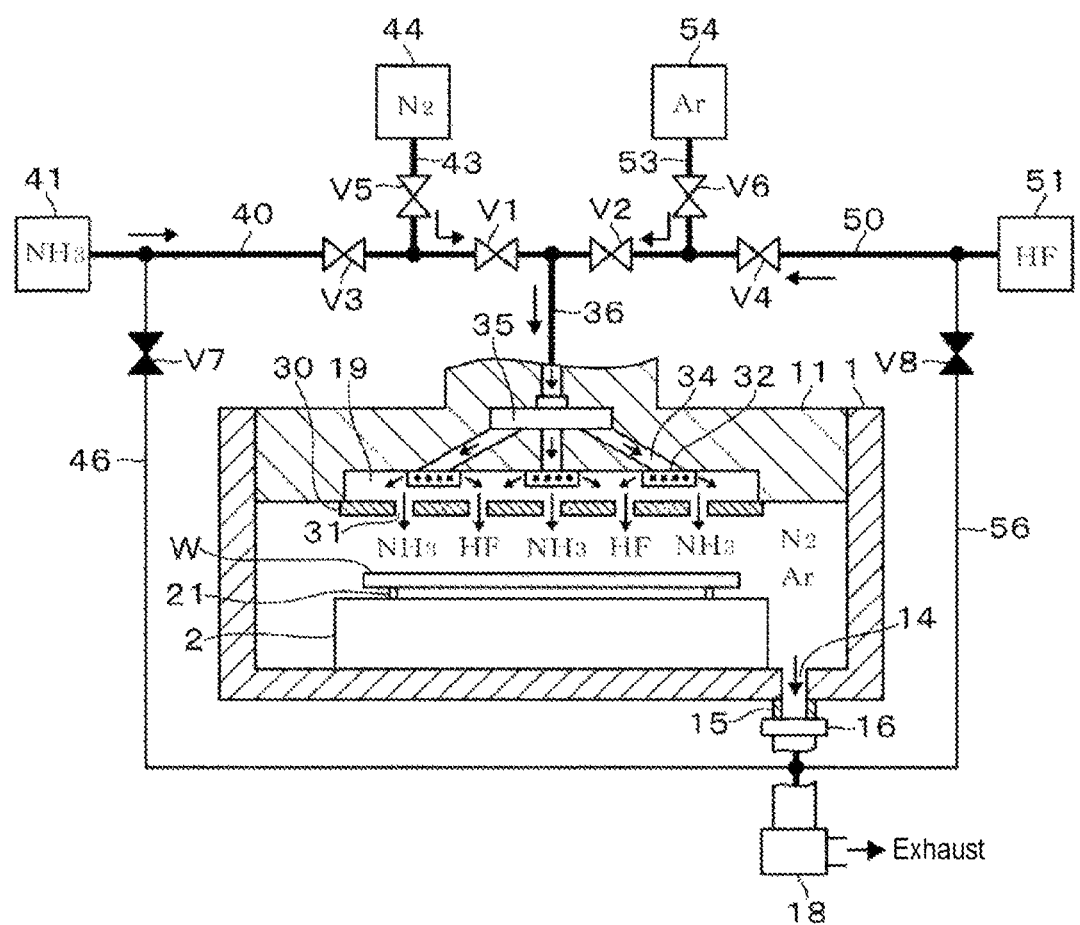

As shown in FIG. 5, if the valve V7 is closed and the valve V3 is opened such that the $NH_3$ gas is mixed with the $N_2$ gas and is diluted therewith. The diluted $NH_3$ gas flows through the $NH_3$ gas supply pipe 40 and is mixed with the Ar gas and the HF gas in the external flow path 36. Thus, the mixed gas of the $NH_3$ gas, the $N_2$ gas, the Ar gas and the HF gas is supplied onto the wafer W through the gas discharge holes 31 in the shower form. In this case, even when the destination of the $NH_3$ gas is changed from the bypass pipe 46 to the process vessel 1, since the flow rate of the $NH_3$ gas has been set to 100 sccm, the mixed gas discharged through the gas discharge holes 31 has a flow rate of 1200 sccm.

As shown in FIG. 4, if the valve V7 is opened and the valve V3 is closed, the supply of the $NH_3$ gas into the process vessel 1 is stopped and simultaneously, the $NH_3$ gas is exhausted while bypassing the process vessel 1. With this configuration, the mixed gas (i.e., pre-mixed gas) obtained by previously mixing the HF gas with the $NH_3$ gas is intermittently supplied to the wafer W through the gas discharge holes 31.

In this embodiment, the $NH_3$ gas is intermittently supplied while the HF gas is supplied to the wafer W. In this case, the period of time Ta (see FIG. 3) during which the mixed gas (i.e., the processing gas) obtained by pre-mixing the HF gas with the $NH_3$ gas is supplied, is set to 1 second, and the period of time Tb during which only the HF gas is supplied without allowing the flow of the $NH_3$ gas is set to 2 seconds. When the $NH_3$ gas is supplied to the wafer W in the intermittent pattern (or a pulse pattern) as described above, the internal pressure of the process vessel 1 is set to, e.g., 250 Pa. Accordingly, when the mixed gas of the HF gas and the $NH_3$ gas were supplied into the process vessel 1, partial pressures of the HF gas and the $NH_3$ gas are 41 Pa and 21 Pa, respectively. The $NH_3$ gas is intermittently supplied into the process vessel 1 by changing the destination of the $NH_3$ gas between the bypass pipe 46 and the process vessel 1. Thus, the flow rate of the $NH_3$ gas which is intermittently supplied into the process vessel 1 becomes stable.

At time t3 (after the first cycle is completed), a second cycle (or subsequent duration) including supplying and shutting off the $NH_3$ gas is further initiated similar to the first cycle. In the second cycle, the supply and shutoff of the $NH_3$ gas are repeated twice in the same manner. In the second cycle, a period of time Tc during which both the HF gas and the $NH_3$ gas is supplied is set to 3 seconds, and a period of time Td during which only the HF gas is supplied without allowing the flow of the $NH_3$ gas is set to 5 seconds. At time t4 at which the second cycle has been completed, the valve V4 is closed to shut off the HF gas, and an inert gas such as the $N_2$ gas and the Ar gas are continuously flowed into the process vessel 1 for a moment. Thereafter, the inert gas is shut off and the wafer W is unloaded from the process vessel 1.

Figure 6:
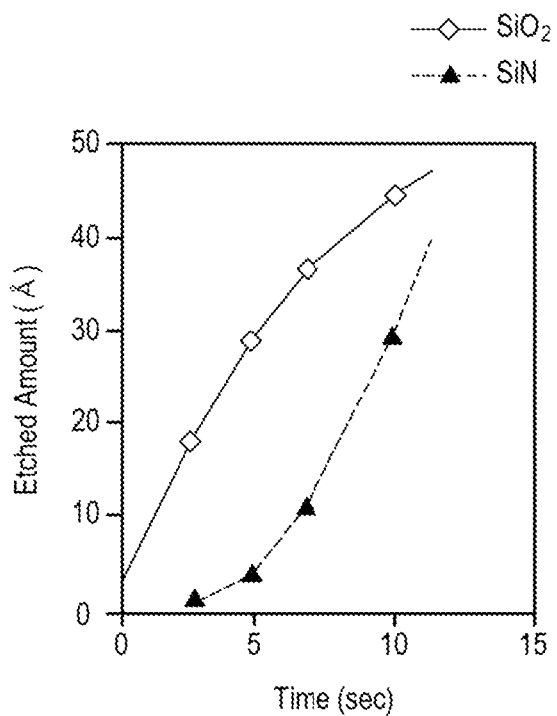
FIG. 6 shows a relationship between a supply time of a processing gas and etched amounts of $SiO_2$ and SiN films.

Next, the results obtained by etching the $SiO_2$ film 69 and the SiN film 66 using the mixed gas of the $NH_3$ gas and the HF gas will be described. FIG. 6 shows a relationship between etched amounts of the $SiO_2$ film 69 and the SiN film 66 and a time at which the mixed gas of the $NH_3$ gas and the HF gas is supplied to the $SiO_2$ film 69 and the SiN film 66. In FIG. 6, ◇ represents the etched amount of the $SiO_2$ film 69, and ▲ represents the etched amount of the SiN film 66. As can be seen from FIG. 6, the $SiO_2$ film 69 is rapidly etched immediately after the mixed gas (i.e., etching gas) is supplied. On the other hand, the SiN film 66 is rarely etched for some moments after the etching gas is supplied, gradually etched after a lapse of about 3 seconds, and rapidly etched after a lapse of 5 seconds, similar to the $SiO_2$ film 69.

The $SiO_2$ and SiN gases undergo a chemical reaction with HF and $NH_3$ molecules, thus producing reaction products such as $(NH_4)_2SiF_6$ (ammonium fluorosilicate), water or the like. As such, a heating process is performed to remove the reaction products. In this way, the etching process is performed. It is presumed from the results shown in FIG. 6 that, the $SiO_2$ film 69 immediately reacts with the $NH_3$ gas and the HF gas, while a surface of the SiN film 66 does not directly react with the $NH_3$ gas and the HF gas.

Figure 7:
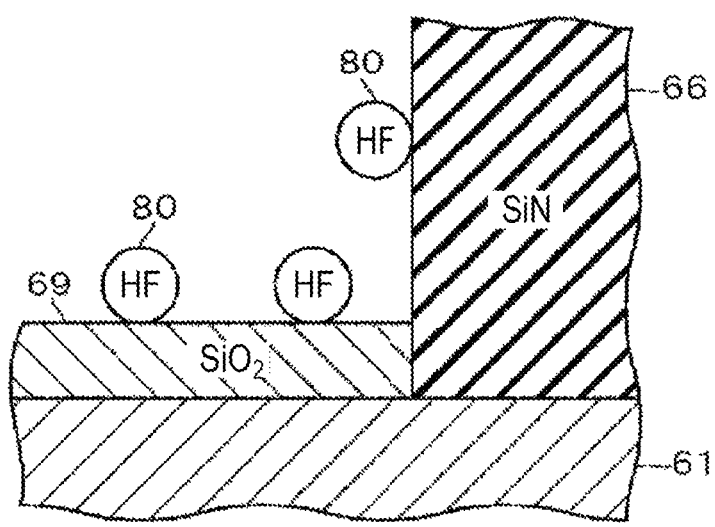
FIGS. 7 to 9 are views showing a state of etching in a surface of the wafer, respectively.
Figure 8:
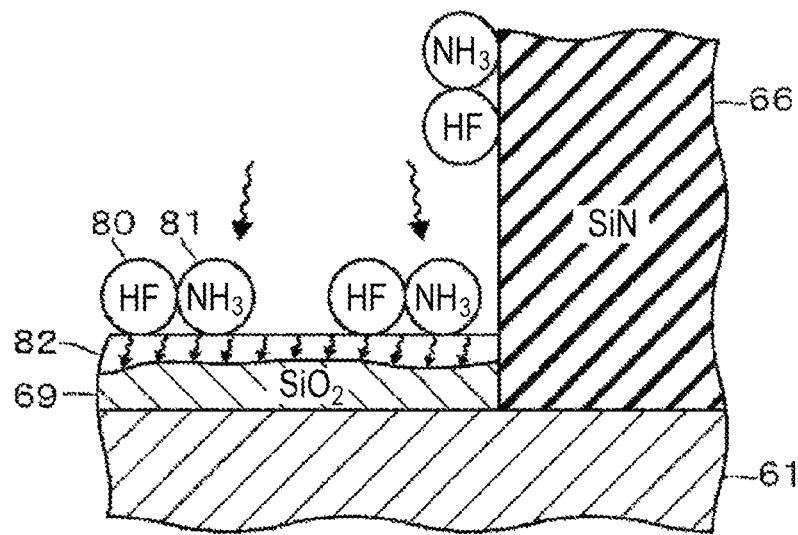
Figure 9:
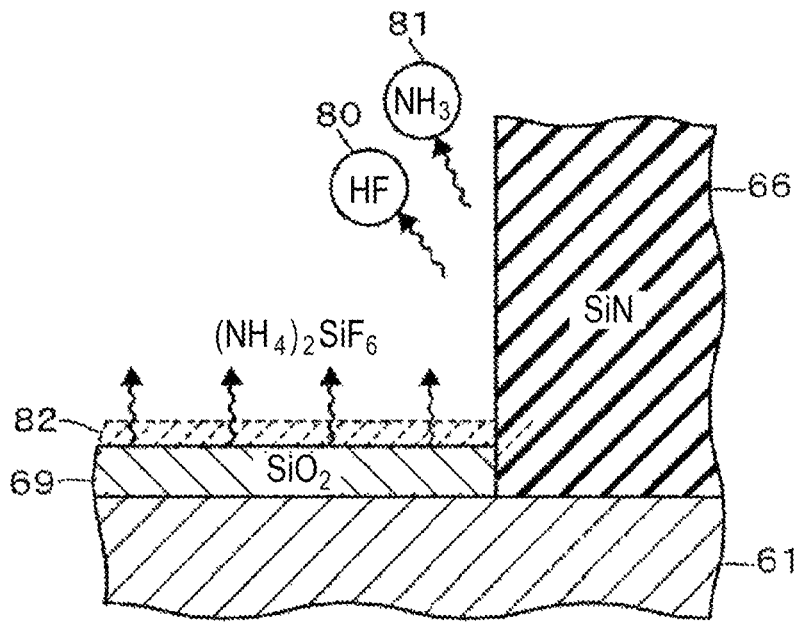

In this embodiment, the reason that the mixed gas of the $NH_3$ gas and the HF gas are supplied to the wafer W in the intermittent pattern (or pulse pattern) is based on the aforementioned viewpoints. FIGS. 7 to 9 are image views schematically showing surface states of the wafer W when the gas supply sequence shown in FIG. 3 is performed. These image views are provided to intuitively check etching states corresponding to the gas supply sequence, and do not exactly show the surface states of the wafer W.

FIG. 7 shows a state where the HF gas is supplied to the wafer W, in which HF molecules 80 are adsorbed onto the surface of the wafer W with the SiN film 66 and the $SiO_2$ film 69 formed on the surface of the S/D region 61 exposed. FIG. 8 shows a state where the $NH_3$ gas is supplied to the wafer W such that a first processing atmosphere of the HF gas is transited to a second processing atmosphere of the mixed gas composed of the $NH_3$ gas and the HF gas. As shown in FIG. 8, the surface of the wafer W is exposed to the second processing atmosphere for 1 second such that the $SiO_2$ film 69 undergoes a chemical reaction with the HF molecules 80 and $NH_3$ molecules 81, thus producing reaction products 82 such as $(NH_4)_2SiF_6$, water or the like.

In the meantime, although the SiN film 66 is exposed to the HF molecules 80 and the $NH_3$ molecules 81, the SiN film 66 manifests a slow reaction. As such, for the period of time Ta (i.e., 1 second) during which the surface of the wafer W is exposed to the second processing atmosphere, the reaction of the SiN film 66 with the mixed gas rarely progresses. Thereafter, since the second processing atmosphere is transited to the first processing atmosphere (containing none of the $NH_3$ gas), the reaction of the SiN film 66 with the HF molecules 80 and the $NH_3$ molecules 81 rarely progresses during the period of time Tb. Since the wafer W is heated at a temperature of 115 degrees C. as described above, the reaction products 82 such as the $(NH_4)_2SiF_6$, water or the like are volatilized, as shown in FIG. 9. Thus, the $SiO_2$ film 69 is selectively etched with respect to the SiN film 66. As described above, the supply and shutoff of the $NH_3$ gas is repeated multiple times, which allows the $SiO_2$ film 69 as the native oxide film to be gradually etched and removed from the surface of the wafer W, while suppressing the SiN film 66 from being etched.

The etching method according to the above embodiment has been described to selectively etch the $SiO_2$ film 69 among the SiN film 66 and the $SiO_2$ film 69 as the native oxide film which are formed on the surface of the wafer W, by intermittently supplying the $NH_3$ gas to the wafer W multiple times while maintaining the supply of the HF gas. Further, the $SiO_2$ film 69 rapidly reacts with the processing gas composed of both the HF gas and the $NH_3$ gas, while the SiN film 66 slowly reacts with the processing gas at a delayed interval, roughly speaking. Based on the delayed interval, supplying the processing gas and shutting off the processing gas, before the reaction of the SiN film 66 with the processing gas is actively conducted, are repeated a number of times until a desired etched amount of the $SiO_2$ film 69 is obtained. This facilitates the selective etching of the $SiO_2$ film 69 to the SiN film 66.

Further, in the above embodiment, after an initial pulse stage in which the supply time of the $NH_3$ gas is relatively short (i.e., the period of time Ta is 1 second) is performed, a subsequent pulse stage in which the supply time of the $NH_3$ gas is relatively long (i.e., the period of time Tc is 3 seconds) is performed. The uppermost surface of the wafer W which is influenced by the exposure to the atmosphere is prone to be etched. In view of this point, to increase controllability of the etching requires shortening a period of etching time immediately after the etching process is initiated. Further, in a case where an etching rate is decreased while the etching is in progress, the period of etching time is lengthened to increase the etched amount of the $SiO_2$ film 69. In this way, the etching rate may be increased.

While in the above embodiment, the processing gas obtained by mixing the HF gas with the $NH_3$ gas has been described to be supplied into the process vessel 1, the present disclosure is not limited thereto. In some embodiments, the HF gas and the $NH_3$ gas may be supplied into the process vessel 1 from different gas supply units. This configuration also allows the $SiO_2$ film 69 to be etched with a high selectivity with respect to the SiN film 66. An example of an etching apparatus using such an etching method may include a post-mix type etching apparatus in which the HF gas and the $NH_3$ gas are separately supplied into the process vessel 1 through gas supply holes of different shower heads. In the post-mix type etching apparatus, the HF gas is continuously supplied into the process vessel 1 from one of the gas supply units, while the $NH_3$ gas is intermittently supplied into the process vessel 1 from the other gas supply unit. Alternatively, if a sufficient etching rate is obtained in the initial pulse stage, the subsequent pulse stage may be omitted.

Figure 10:
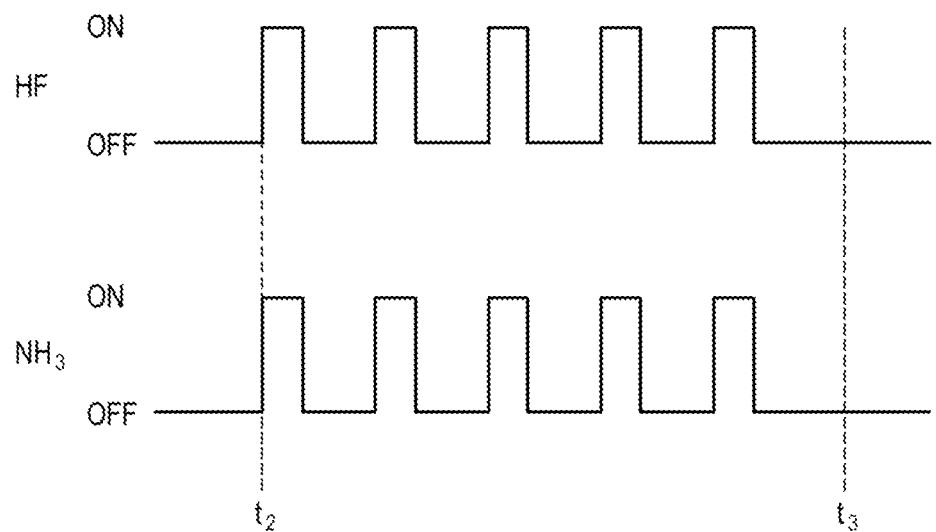
FIG. 10 is a time chart showing a supply/shutoff of a processing gas in another embodiment of the present disclosure.

In some embodiments, as shown in FIG. 10, both the HF gas and the $NH_3$ gas may be simultaneously supplied into the process vessel 1 in a pulse pattern over the first cycle for example. In this case, the supply and shutoff of the HF and $NH_3$ gases are performed by controlling opening/closing operations of the valves V3, V4, V7 and V8. Once the supply of the HF gas is paused, the HF gas is exhausted together with the $NH_3$ gas through the bypass pipe 56 while bypassing the process vessel 1. In this embodiment, a period of time during which the wafer W is exposed to the processing gas obtained by mixing the HF gas and the $NH_3$ gas and a period of time during which the wafer W is not exposed to any of the HF gas and the $NH_3$ gas, are alternately repeated multiple times. This configuration makes it possible to achieve a high selective etching of the $SiO_2$ film 69 to the SiN film 66.

Figure 11:
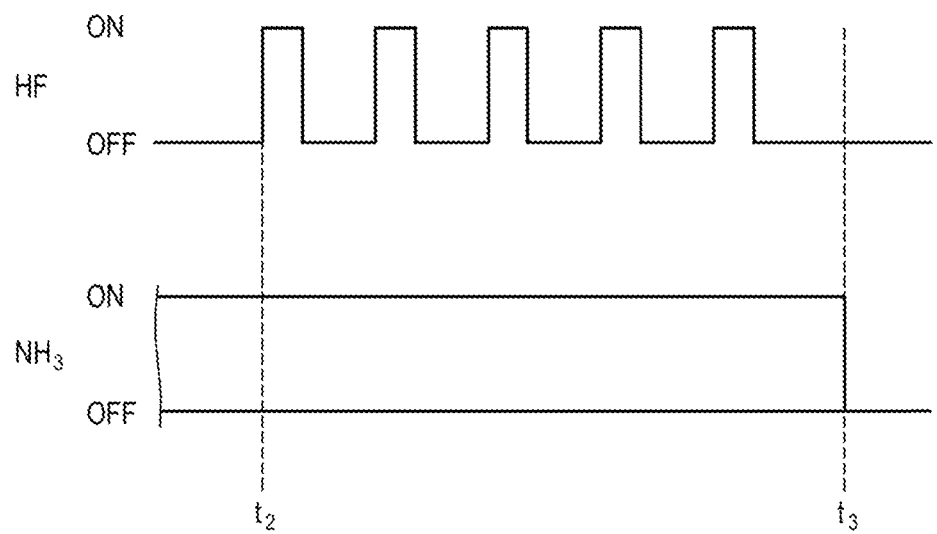
FIG. 11 is a time chart showing a supply/shutoff of a processing gas in still another embodiment of the present disclosure.

In some embodiments, as shown in FIG. 11, the HF gas may be intermittently supplied multiple times while the $NH_3$ gas is continuously supplied into the process vessel 1. In this case, the wafer W is first kept at an atmosphere of the processing gas composed of the HF gas and the $NH_3$ gas and subsequently, at an atmosphere of the mixed gas of the $NH_3$ gas, the $N_2$ gas and the Ar gas, excluding the HF gas. This configuration also allows the $SiO_2$ film 69 and the SiN film 66 to be intermittently exposed to the atmosphere of the mixed gas composed of the HF gas and the $NH_3$ gas, thus resulting in the same effects as the above.

The present inventors compared the method of intermittently supplying the $NH_3$ gas while flowing the HF gas (see FIG. 3), the method of intermittently supplying the HF gas while flowing the $NH_3$ gas (see FIG. 11), and the method of simultaneously supplying and shutting off the HF gas and the NH$_3$ gas (see FIG. 10) with each other. This comparison has shown that, as described later in the following examples, the method of intermittently supplying the NH$_3$ gas while flowing the HF gas manifests the greatest etching selectivity. The reason for this may be that the HF gas is previously adsorbed onto the surface of the SiN film 66, which makes it difficult to produce the (NH$_4$)$_2$SiF$_6$ by the reaction.

In some embodiments, the SiO$_2$ film 69 may be etched using a processing gas composed of nitrogen, hydrogen and fluoride, e.g., an ammonium fluoride (NH$_4$F) gas. In this case, the processing gas reacts with the SiO$_2$ film 69 to generate (NH$_4$)$_2$SiF$_6$. With this configuration, by intermittently supplying the ammonium fluoride (NH$_4$F) gas multiple times to the wafer W on which the SiO$_2$ film 69 and the SiN film 66 are formed, it is possible to etch the SiO$_2$ film 69 with a high selectivity with respect to the SiN film 66 as described above.

That is, the etching method according to the present disclosure intermittently exposes the substrate to be processed to the atmosphere of the mixed gas (as the processing gas) of the NH$_3$ gas and the HF gas multiple times, or an atmosphere of the processing gas composed of a compound (e.g., NH$_4$F gas or NH$_4$FHF) of nitrogen, hydrogen and fluorine. A mixed gas of the NH$_3$ gas, the HF gas and the NH$_4$F gas (or the NH$_4$FHF gas) may be used as an example of the processing gas.

Further, as shown in FIG. 6, an etched amount of the SiO$_2$ film is increased immediately after the processing gas is supplied, while an etched amount of the SiN film is rapidly increased after a lapse of 5 seconds. Thus, a period of time during which the processing gas is supplied to the substrate to be processed in a gas supply sequence, may be set to a range of 0.1 to 5 seconds. In some embodiments, since the etched amount of the SiN film is sufficiently small, a period of time during which the supply of the processing gas to the substrate to be processed is stopped in a gas supply sequence may be set to a range of 1 to 15 seconds. This configuration makes it possible to sufficiently increase an etching selectivity of the SiO$_2$ film 69 to the SiN film 66.

Further, as described in Example 3 (which will be described later), in a case where a partial pressure of the HF gas is set to 80 Pa or lower and a partial pressure of the NH$_3$ gas is set to 140 Pa or lower, a ratio of the NH$_3$ gas to the HF gas in the partial pressure may be set to 1 or higher. In this case, the processing gas is configured to be widely spread up to a narrow portion. Such a configuration makes, in the SiO$_2$ film 69 shown in FIG. 9, an etched amount in the vicinity of the SiN film 66 and an etched amount in a portion spaced from the vicinity uniform, thereby smoothing the S/D region 61 and the surface of the SiN film 66. Even in a hole (recess) having a high level of depth and a small diameter, or a wiring pattern having a high level of depth and a narrow width, the processing gas is widely spread up to narrow portions, which makes it possible to selectively remove the SiO$_2$ film 69 positioned in the hole or the bottom of the wiring pattern in an effective manner. An etching rate may become too slow if each of the partial pressures of the HF gas and the NH$_3$ gas is too low. Because of this, the partial pressure of the HF gas may be set to 10 to 80 Pa, and the partial pressure of the NH$_3$ gas may be set to 10 to 140 Pa.

The present disclosure is not limited to the etching apparatus 100 shown in FIG. 1. Alternatively, an apparatus may be used in which a processing gas atmosphere containing a mixed gas of an NH$_3$ gas and an HF gas is always formed locally at a vacuum atmosphere, and a substrate to be processed is intermittently exposed to the processing gas atmosphere multiple times. An example of the apparatus may include an apparatus in which the substrate to be processed is mounted on a rotary table inside a vacuum vessel while being placed at a position deviated from the center of the rotary table, a processing block having a low ceiling is provided in a portion of a region to which the substrate to be processed moves with the rotation of the rotary table, and the rotary table is rotated multiple times while the processing gas is supplied into the processing block. The term "film" in the SiO$_2$ film and the SiN film used herein not only means a thin layer but also means a block-shape film.

EXAMPLES

Now, various examples will be described to verify effects of the embodiments of the present disclosure.

Example 1-1

Using a wafer for evaluation in which an SiO$_2$ film and an SiN film are exposed, the sequence (shown in FIG. 3) of the etching method according to the above embodiment was performed by the etching apparatus 100 shown in FIG. 1. Specifically, while flowing an HF gas, supplying an NH$_3$ gas for 1 second and stopping the supply of the NH$_3$ gas for 2 seconds were repeated five times. Subsequently, supplying the NH$_3$ gas for 3 seconds and stopping the supply of the NH$_3$ gas for 5 seconds were repeated twice. At this time, an internal process pressure of a process vessel was 250 Pa (1.88 Torr), and an internal process temperature thereof was 115 degrees C.

Example 1-2

Instead of the pre-mix type etching apparatus shown in FIG. 1, using the aforementioned post-mix type etching apparatus in which the HF gas and the NH$_3$ gas are separately supplied into the process vessel 1 through gas discharge holes formed in respective shower heads, an etching process was performed on the wafer for evaluation according to the same sequence as Example 1-1.

Comparative Example

Using the post-mix type etching apparatus in which the HF gas and the NH$_3$ gas are separately supplied into the processing vessel through the gas discharge holes of the respective shower heads, the HF gas and the NH$_3$ gas were supplied into the process vessel 1 for 11 seconds to perform the etching process.

(Results and Consideration)

Figure 12:
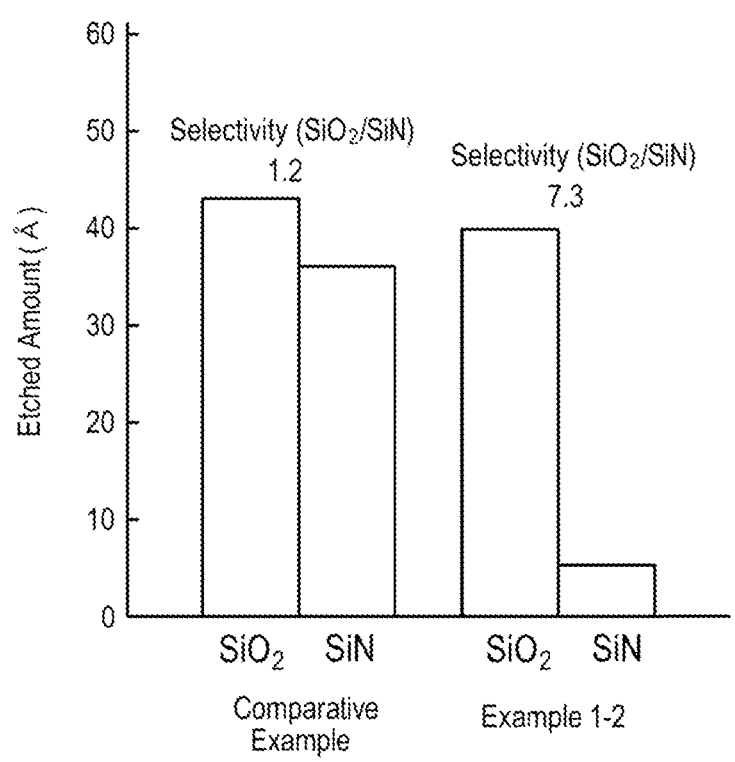
FIG. 12 shows an etching characteristic according to an etching method in both an Example and a Comparative Example.

In Example 1-1, an etching selectivity of the SiO$_2$ film to the SiN film was 15.5, which was the highest value. FIG. 12 shows etched amounts of the SiO$_2$ film and the SiN film, and etching selectivities of the SiO$_2$ film to the SiN film, for each of Example 1-2 and Comparative Example. In the Comparative Example, the SiO$_2$ film was etched by almost same amount as the SiN film and the selectivity thereof was at a low level of 1.2. In contrast, in Example 1-2, although the SiO$_2$ film was etched to the almost same extent as the Comparative Example, the SiN film was rarely etched. That is, the etching selectivity of the SiO$_2$ film to the SiN film was at a high level of 7.3. This result has shown that the etching selectivity of the SiO$_2$ film to the SiN film can be increased by using the etching method of the present disclosure.

Figure 13:
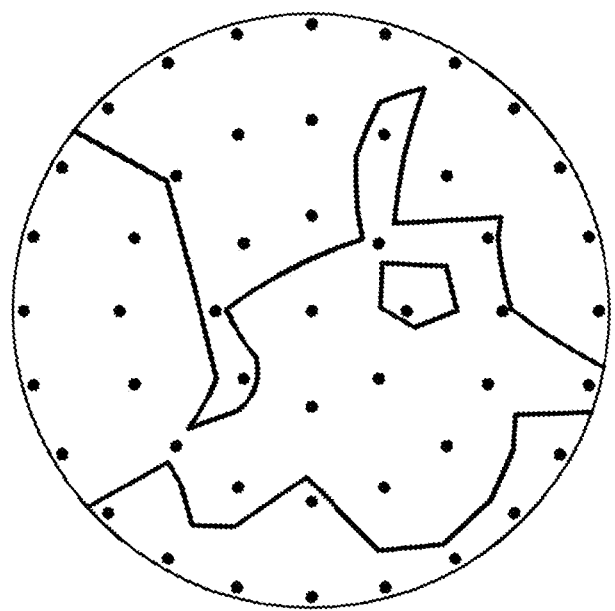
FIG. 13 is a contour diagram showing an etched amount of a wafer according to one example.
Figure 14:
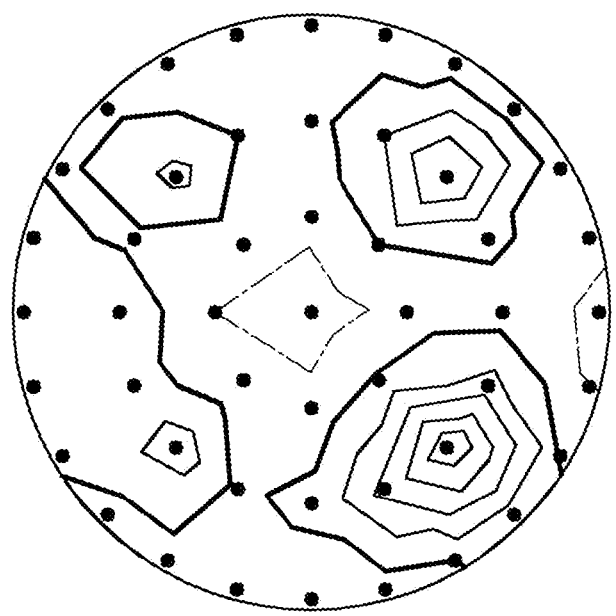
FIG. 14 is a contour diagram showing an etched amount of a wafer according to another example.

FIGS. 13 and 14 are contour diagrams showing a distribution of etched amounts of a surface of the wafer after being subjected to the etching process in Examples 1-1 and 1-2, respectively. In FIGS. 13 and 14, each dot mark represents a position at which an etched amount is measured, a bold line represents a contour line corresponding to etched amounts at a target level, a solid line represents a contour line corresponding to relatively high etched portions above the target level, and a broken line represents a contour line corresponding to relatively low etched portions below the target level. This result shows that the use of the pre-mix type etching apparatus may result in a higher level of in-plane uniformity. Alternatively, the improvement of the in-plane uniformity may be achieved by modifying structures of shower heads or the like in order to uniformly supply a processing gas onto the surface of the wafer W.

Example 2

Example 2 is similar to Example 1-1 except that, while flowing the $NH_3$ gas, supplying the HF gas for 1 second and shutting out the supply of the HF gas for 2 seconds were repeated five times, and subsequently, supplying the HF gas for 3 seconds and shutting out the supply of the HF gas for 5 seconds were repeated twice.
(Results and Consideration)
In Example 2, the etching selectivity of the $SiO_2$ film to the SiN film was 7.3. The etching selectivity of the $SiO_2$ film to the SiN film can be increased by intermittently exposing the wafer W to the processing gas atmosphere containing the $NH_3$ gas and the HF gas. Alternatively, larger effects can be obtained by intermittently supplying the $NH_3$ gas while flowing the HF gas.

Example 3

Figure 15:
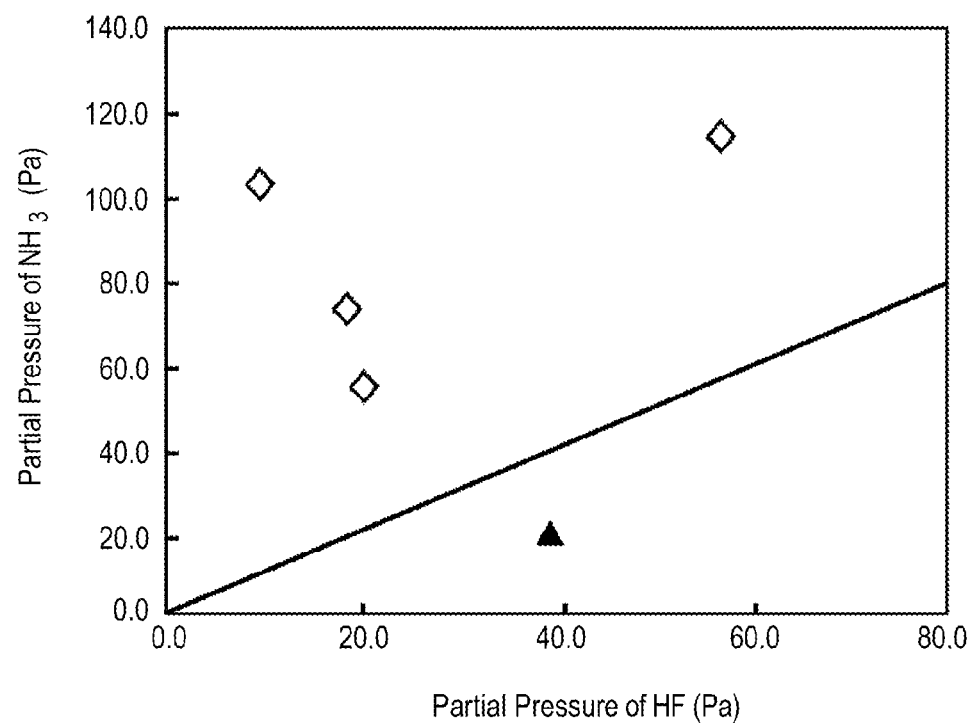
FIG. 15 is a characteristic graph showing a relationship between partial pressures of HF and $NH_3$ gases and an acceptability of an etching finish state.

In Examples 1-1 and 1-2, when the processing gas composed of the HF and $NH_3$ gases is supplied into the process vessel 1 where the internal pressure is adjusted to 250 Pa, flow rates of the HF and $NH_3$ gases were adjusted such that each of the partial pressures of the HF and $NH_3$ gases is set to (the partial pressure of the HF gas:the partial pressure of the $NH_3$ gas)=(12:105), (20:73), (22:55), (58:115) and (38:19). Subsequently, an evaluation was performed to determine an acceptability of an etching finish state in surfaces of films after being subjected to the etching process.
FIG. 15 is a characteristic graph showing the results of etching performed when partial pressures of HF and $NH_3$ gases are set to respective pressures. In FIG. 15, a symbol ◇ represents an example where a processing gas is widely spread to narrow portions so that an etching is uniformly performed up to the proximity of a SiN film, thereby finishing a surface of an $SiO_2$ film in a smooth state after the entirety of the $SiO_2$ film is removed. A symbol ▲ represents an example where an etching of the $SiO_2$ film in the proximity of the SiN film is performed slowly so that the $SiO_2$ film is not finished to have a smooth surface after the entirety of the $SiO_2$ film is removed. A straight line indicated in FIG. 15 represents that a ratio of the $NH_3$ gas to the HF gas in the partial pressure is 1:1. This result has shown that, in a case where the partial pressure of the HF gas is set to 80 Pa or lower and the partial pressure of the $NH_3$ gas is set to 140 Pa or lower, when the ratio of the $NH_3$ gas to the HF gas in the partial pressure is set to 1 or higher, the etching is uniformly performed up to the vicinity of the SiN film, thus obtaining a smoothly etched surface. According to the present disclosure, it is possible to spread up to narrow portions, thus efficiently etching the $SiO_2$ film positioned in the narrow portions.
As described above, the method according to the present disclosure selectively etches the $SiO_2$ film among the SiN film and the $SiO_2$ film formed on the substrate to be processed. The method intermittently exposes the substrate to be processed to at least one of a processing gas composed of HF and $NH_3$ gases, and a processing gas composed of a compound of N (nitrogen), H (hydrogen) and F (fluorine). The $SiO_2$ film rapidly reacts with the processing gas composed of the HF and $NH_3$ gases, whereas the SiN film gradually reacts with the processing gas composed of the HF and $NH_3$ gases. Accordingly, a period of time during which the SiN film and the $SiO_2$ film are continuously exposed to the at least one processing gas is shortened, thus suppressing the reaction of the SiN film with the at least one processing gas from progressing, which makes it possible to selectively etch the $SiO_2$ film with respect to the SiN film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A method of selectively etching a silicon oxide film among a silicon nitride film and the silicon oxide film formed on a surface of a substrate to be processed, the silicon nitride film and the silicon oxide film having exposed portions, respectively, the method comprising:
under a vacuum atmosphere, intermittently supplying at least one of a first processing gas composed of a hydrogen fluoride gas and an ammonia gas and a second processing gas composed of a compound of nitrogen, hydrogen and fluorine, to the exposed portions of the silicon oxide film and the silicon nitride film on the substrate to be processed multiple times to selectively etch the silicon oxide film.
2. The method of claim 1, wherein a period of time during which the at least one of the first and second processing gases is supplied to the substrate to be processed in a gas supply sequence is set to a range of 0.1 to 5 seconds.
3. The method of claim 1, wherein a period of time during which the supply of the at least one of the first and second processing gases to the substrate to be processed is stopped in a gas supply sequence is set to a range of 1 to 15 seconds.
4. The method of claim 1, wherein the compound includes any one of $NH_4F$ and $NH_4FHF$.
5. The method of claim 1, wherein supplying includes intermittently supplying the first processing gas obtained by previously mixing the hydrogen fluoride gas with the ammonia gas from a gas supply unit to the substrate to be processed loaded into a process vessel while the process vessel is vacuum exhausted.
6. The method of claim 5, wherein the intermittently supplying includes continuously supplying the hydrogen fluoride gas from the gas supply unit, and intermittently mixing the ammonia gas with the hydrogen fluoride gas.
7. The method of claim 5, wherein the gas supply unit includes a plurality of gas discharge holes formed to face the substrate to be processed loaded in the process vessel.
8. The method of claim 1, wherein supplying includes setting a duration in which the at least one of the first and second processing gases is supplied to the substrate to be processed in a gas supply sequence as an initial duration and a subsequent duration,
wherein a period of time during which the at least one of the first and second processing gases is supplied to the substrate to be processed in the subsequent duration is set to be longer than that in the initial duration.

9. The method of claim 8, wherein a period of time during which the supply of the at least one of the first and second processing gases to the substrate to be processed is stopped in the subsequent duration, is set to be longer than that in the initial duration.

10. The method of claim 1, wherein, under the vacuum atmosphere, a partial pressure of the hydrogen fluoride gas is set to a range of 10 to 80 Pa, and a partial pressure of the ammonia gas is set to a range of 10 to 140 Pa, and wherein a ratio of the ammonia gas to the hydrogen fluoride gas in the partial pressure is 1 or higher.

11. A non-transitory computer-readable storage medium storing a program for causing a computer to execute a method of selectively etching a silicon oxide film among a silicon nitride film and the silicon oxide film formed on a surface of a substrate to be processed loaded into a process vessel, wherein the program includes instructions to execute the method of claim 1.

\* \* \* \* \*